United States Patent
Szady

(10) Patent No.: US 12,052,017 B2
(45) Date of Patent: Jul. 30, 2024

(54) CONTROLLED QUANTUM LOGIC REPLACEMENT GATES AND METHODS FOR USE THEREWITH

(71) Applicant: BEIT Inc., Millbrae, CA (US)

(72) Inventor: Adam Szady, Cracow (PL)

(73) Assignee: BEIT Inc., Millbrae, CA (US)

( * ) Notice: Subject to any disclaimer, the term of this patent is extended or adjusted under 35 U.S.C. 154(b) by 0 days.

(21) Appl. No.: 18/449,827

(22) Filed: Aug. 15, 2023

(65) Prior Publication Data

US 2023/0396254 A1  Dec. 7, 2023

Related U.S. Application Data

(63) Continuation of application No. 17/447,842, filed on Sep. 16, 2021, now Pat. No. 11,777,505.

(60) Provisional application No. 63/084,187, filed on Sep. 28, 2020.

(51) Int. Cl.
*H03K 19/195* (2006.01)
*B82Y 10/00* (2011.01)
*G06N 10/00* (2022.01)

(52) U.S. Cl.
CPC .......... *H03K 19/195* (2013.01); *B82Y 10/00* (2013.01); *G06N 10/00* (2019.01)

(58) Field of Classification Search
None
See application file for complete search history.

(56) References Cited

U.S. PATENT DOCUMENTS

| 11,030,546 B2 | 6/2021 | Gidney | |
| 2019/0205783 A1* | 7/2019 | Nam | G06N 10/00 |
| 2020/0394544 A1* | 12/2020 | Low | G16C 10/00 |

OTHER PUBLICATIONS

Abdessaied et al.; Technology Mapping of Reversible Circuits to Clifford+T Quantum Circuits; IEEE 46th International Symposium on Multiple-Valued Logic; May 2016; pp. 150-155.
Berry, et al. "Qubitization of Arbitrary Basis Quantum Chemistry Leveraging Sparsity and Low Rank Factorization", arXiv:1902.02134v4 [quant-ph] Nov. 27, 2019, 44 pgs.
Garcia-Escartin et al.; Equivalent Quantum Circuits; arXiv:1110.2998v1; Oct. 2011; 13 pgs [retrieved on Dec. 14, 2021]. Retrieved from <https://arxiv.org/abs/1110.2998v1>.
Gidney, "Halving the cost of quantum addition", Google, Santa Barbara, CA, USA, arXiv:1709.06648v3 [quant-ph], Jun. 13, 2018, 6 pages.
Henriet et al.; Quantum computing with neutral atoms; arXiv:2006.12326v1, Jun. 2020 [retrieved on Dec. 14, 2021]. Retrieved from <https://arxiv.org/abs/2006.12326v1>; pp. 10-13.

(Continued)

*Primary Examiner* — Anh Q Tran
(74) *Attorney, Agent, or Firm* — Garlick & Markison; Bruce E. Stuckman

(57) ABSTRACT

A controlled quantum logic gate implements a replacement for an n−1 qubit controlled X gate function to n qubits, wherein n is greater than 4. The quantum logic gate includes a controlled gate or controlled Z gate equivalent that selectively applies, under control of a first subset of the n qubits, a pi radian Z-axis Bloch sphere rotation or a phase flip to a target qubit of the n qubits. A pair of controlled Hadamard gates selectively conjugate the target qubit under control of a second subset of the n qubits.

20 Claims, 16 Drawing Sheets

(56) References Cited

OTHER PUBLICATIONS

International Searching Authority; International Search Report and Written Opinion; International Application No. PCT/US2021/050833; Dec. 29, 2021; 9 pgs.

Internet Post "How to construct a multi-quibit controlled-Z from elementary gates?", retrieved from the internet at https://quantumcomputing.stackexchange.com/questions/4078/how-to-construct-a-multi-qubit-controlled-z-from-elementary-gates, Aug. 23, 2018, 8 pages.

Jones, "Novel constructions for the fault-tolerant Toffoli gate",v Edward L Ginzton [quant-ph] Laboratory, Stanford University, Stanfor, California, USA, arXiv:1212.5069v1 [quant-ph], Dec. 20, 2012, 5 pages.

Maslov, "On the advantages of using relative phase Toffolis with an application to multiple control Toffoli optimization", National Science Foundation, Arlington, VA, US, arXiv:1508.03273v2 [quant-ph], Jan. 5, 2016, 14 pages.

Paetznick, et al. "Universal fault-tolerant quantum computation with only transversal gates and error correction" arXiv:1304.3709v2 [quant-ph] Sep. 4, 2013, 5 pages.

Shende, et al. "On the CNOT-cost of TOFFOLI gates", arXiv:0803.2316v1 [quant-ph] Mar. 15, 2008, 28 pgs.

Shi, "Toffoli or Control-NOT needs little help to do universal quantum computation" Computer Science Departmant and Institute for Quantum Information, California Institute of Technology, Pasadena, CA, US, arXiv:quant-ph/0205115, May 18, 2002, 11 pages.

Song, et al. "The Simplified Toffoli Gate Implementation by Margolus is Otimal" Department of Computer Science, Texas A&M University, College Station, TX, US, arXiv:quant-ph/0312225v1, Dec. 31, 2009, 15 pages.

Upreti, et al.; Design of Quantum Circuits to Play Archery in a Quantum Computer; ResearchGate, DOI:10.13140/RG.2.2.21438.02880, Dec. 2019 [retrieved on Dec. 14. 2021]. Retrieved from <https://www.researchgate.net/publication/338263159_Design_of_Quantum_Circuits_to_Play_Archery_in_a_Quantum_Computer>.

Varun Upreti et al., "Design of Quantum Circuits to Play Archery in a Quantum Computer", ResearchGate, DOI:10.1340/GR.2.2.21438.02880, pp. 1-10, Dec. 2019.

* cited by examiner 100 (Prior Art)

150

112

114

US 12,052,017 B2

CONTROLLED QUANTUM LOGIC REPLACEMENT GATES AND METHODS FOR USE THEREWITH

CROSS-REFERENCE TO RELATED APPLICATIONS

The present U.S. Utility patent application claims priority pursuant to 35 U.S.C. § 120 as a continuation of U.S. Utility application Ser. No. 17/447,842, entitled "CONTROLLABLE QUANTUM LOGIC GATES AND METHODS FOR USE THEREWITH", filed Sep. 16, 2021, which claims priority pursuant to 35 U.S.C. § 119(e) to U.S. Provisional Application No. 63/084,187, entitled "CONTROLLABLE QUANTUM LOGIC GATES AND METHODS FOR USE THEREWITH", filed Sep. 28, 2020, both of which are hereby incorporated herein by reference in their entirety and made part of the present U.S. Utility patent application for all purposes.

BACKGROUND OF THE INVENTION

Technical Field of the Invention

This invention relates generally to computer systems and particularly to quantum computing techniques and circuits.

Description of Related Art

Computing devices are known to communicate data, process data, and/or store data. Such computing devices range from wireless smart phones, laptops, tablets, personal computers (PC), work stations, smart watches, connected cars, and video game devices, to web servers and data centers that support millions of web searches, web applications, or on-line purchases every day. In general, a computing device includes a processor, a memory system, user input/output interfaces, peripheral device interfaces, and an interconnecting bus structure.

Classical digital computing devices operate based on data encoded into binary digits (bits), each of which has one of the two definite binary states (i.e., 0 or 1). In contrast, a quantum computer utilizes quantum-mechanical phenomena to encode data as quantum bits or qubits, which can be in superpositions of the traditional binary states.

BRIEF DESCRIPTION OF THE SEVERAL VIEWS OF THE DRAWING(S)

DETAILED DESCRIPTION OF THE INVENTION

Figure 1A:
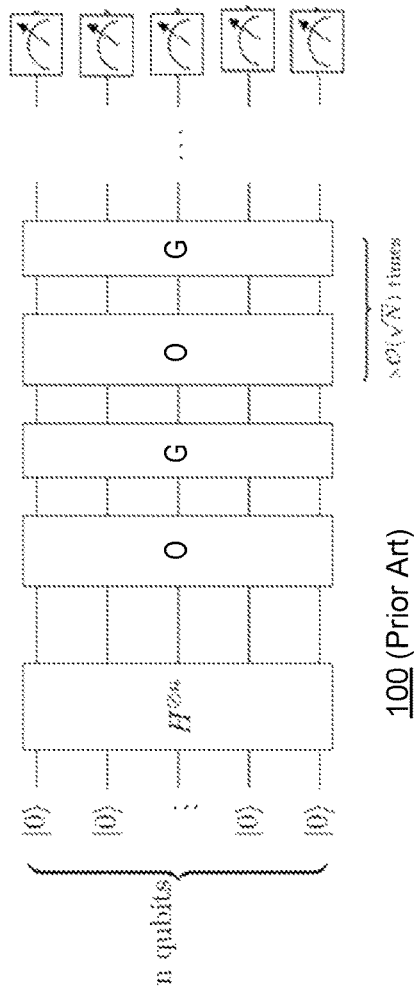
FIG. 1A is a schematic block diagram of a prior art quantum circuit.

FIG. 1A is a schematic block diagram 100 of a prior art quantum circuit. In particular, a quantum circuit implementation of Grover's algorithm is presented. Grover's algorithm is a quantum algorithm that finds, with high probability, the unique input to a black box function called a "quantum oracle", "oracle operator", "oracle function" or simply "oracle" that produces a particular output value, using just O(sqrt(N)) evaluations of the oracle function, where N is the size of the function's domain. Grover's algorithm has been applied to the problem of unstructured database search, or more generally the inversion of a function.

In operation, n qubits are initialized and applied to a corresponding number of Hadamard (H) gates on each input are Hadamard transformed in order to achieve a uniform superposition of all the initial states. An oracle gate (O) performs an oracle call for each of the transformed qubit states and a diffusion gate (G) performs the Grover diffusion operator. This process is repeated O(sqrt(N)) times. A measurement of the qubits after this point yields the quantum solution with a probability that approaches 1 for large values of N. See e.g., John Wright, Lecture 4: Grover's Algorithm, Carnegie Mellon University, Sep. 21, 2015.

Figure 1B:
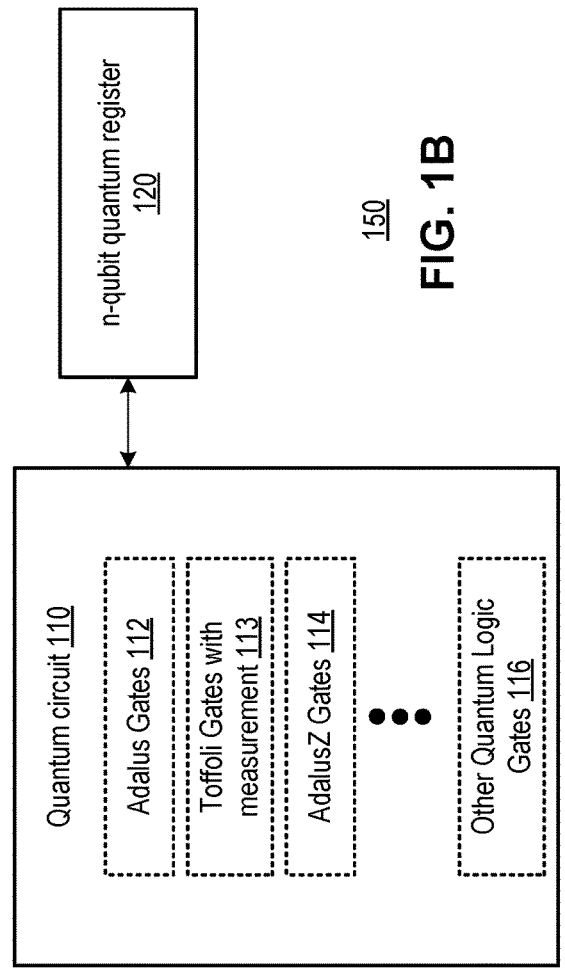
FIG. 1B is a block diagram of an embodiment of a quantum computing architecture in accordance with various embodiments.

FIG. 1B is a block diagram 150 of an embodiment of a quantum computing architecture in accordance with the present invention. In particular, a quantum circuit 110 is presented that includes one or more Adalus gates 112, and/or one or more Toffoli gates with measurement 113, and/or one or more AdalusZ gates 114 and/or one or more other quantum logic gates 116 that operate on n qubits of a quantum register 120.

In various embodiments, the other quantum logic gates 116 can include: Hadamard gates (H) that apply Hadamard transforms one or more of the plurality of qubits in a corresponding plurality of initial states to generate a corresponding plurality of transform results; oracle gates (O) that call a quantum oracle operator on the corresponding plurality of transform results and/or other initial states to produce a sequence of quantum oracle calls; and/or Grover diffusion gates (G) that apply one or more different diffusion operator. The other quantum logic gates 116 can further include X gates, Y gates, Z gates, Phase shift gates, Controlled gates, such as CX, CY and/or CZ gates, swap gates, other Toffoli gates, Deutsch gates, Ising gates, Fredkin gates, and/or other quantum logic gates and combinations thereof in various circuit configurations. In operation, the quantum circuit 110 generates a quantum computing result based on a measurement from the plurality of qubits.

Consider an example implementation of Grover's algorithm where a quantum circuit 110 uses oracle testing for the solution in an n-qubit quantum computer register 120 containing the superposition of all the candidate solutions—created using Hadamard transforms on the qubits in a said register and may or might not use additional (ancillary) working qubits. As used in this context, the quantum oracle function can be external to the computation pictured, hence a "black box" or be a quantum function where the gates constituting it can be modified, hence a part of the computation described (like a function testing the satisfiability of a set of clauses by the assignments of variables in the superposition). In this example oracle gates (O) can be used to call a quantum oracle operator on a plurality of qubit states to produce a sequence of quantum oracle calls. A plurality of diffusion gates (G) can apply a plurality of different diffusion operators, wherein a selected one or more of a plurality of diffusion operators is applied after each of the quantum oracle calls in the sequence of oracle calls. While a plurality of different diffusion operators are used, one or more of these different diffusion operators can be applied more than once. The quantum circuit 110 generates a quantum computing result based on a measurement from the plurality of qubits, after having applied the sequence of oracle calls and the plurality of diffusion operators. The Adalus gates 112, Toffoli gates with measurement 113 and/or AdalusZ gates 114 can be used to implement diffusion gates and/or other components of a quantum circuit 110, and further can be used in circuit implementations of quantum solutions, other than the Grover's Algorithm example discussed above.

In various embodiments, the Adalus gates 112, Toffoli gates with measurement 113, AdalusZ gates 114 and other quantum logic gates 116 of the quantum circuit 110 can be implemented with one or more processing devices. Each such processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. Each such processing device can operate in conjunction with an attached memory and/or an integrated memory element such as classical memory or other memory device, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information.

Note that if the quantum circuit 110 is implemented via more than one processing device, the processing devices may be centrally located (e.g., directly coupled together via a wired and/or wireless bus structure) or may be distributedly located (e.g., cloud computing via indirect coupling via a local area network and/or a wide area network). Further note that if the quantum circuit 110 implements one or more of its gates or other functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, a memory can store, and a processing device can execute, hard coded and/or other operational instructions corresponding to at least some of the steps and/or functions illustrated in one or more of the Figures. Such a memory device or memory element can be tangible memory device or other non-transitory storage medium included in or implemented as an article of manufacture.

Further discussion regarding the operation of the Adalus gates 112, Toffoli gates with measurement 113 and the AdalusZ gates 114, including several optional functions and features are described in conjunction with the FIGs. that follow.

The action of any particular quantum gate on a specific quantum state can be found by multiplying an input vector, which represents the input qubit state, by the matrix U representing the gate. The result is a new quantum vector state. The input vector state can be represented by:

$$|\psi_1\rangle$$

The output vector state can be represented by:

$$|\psi_2\rangle$$

And, further:

$$U|\psi_1\rangle = |\psi_2\rangle$$

Figure 1C:
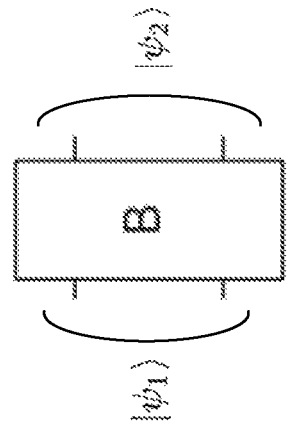
FIGS. 1C-1D are block diagrams of embodiments of equivalent quantum logic gates in accordance with various embodiments.
Figure 1D:
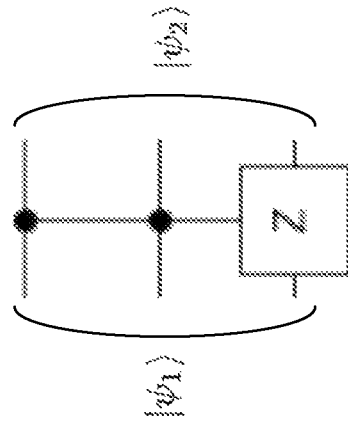

Most current architectures of quantum computers use two kinds of gates: the first one being single qubit gates, i.e. any unitary transformation of a single qubit; the second type of implemented gate acts simultaneously on two qubits. Examples of the native 2-qubit gates employed by current quantum computers are a ZZ gate (Honeywell), a CNOT gate (IBM), a CZ gate (Rigetti) and a Molmer-Sorensen gate (IonQ), etc. Two 2-qubit quantum logic gates can be said to be equivalent if, when used in combination with one or more single qubit gates, produce the same output vector state in response to a common input vector state. This is because the operations performed by the 1-qubit gates are considered to be computationally free/easy compared to use of the 2-qubit gate. Consider the 2-qubit quantum circuits shown in FIGS. 1C and 1D. The two 2-qubit gates A, B are equivalent if $U1 \cdot U2 \cdot A \cdot V1 \cdot V2 = B$ where U1, V1, U2, V2 are 1-qubit gates acting on first and second qubit respectively. Said another way, the quantum circuits of FIGS. 1C and 1D implement the same operation, i.e. they share the same unitary matrix U.

Figure 1E:
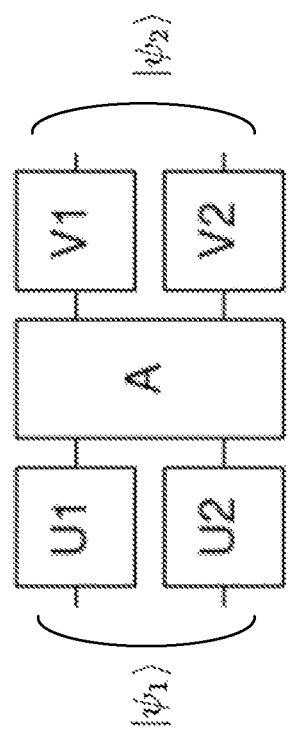
FIGS. 1E-1H are schematic block diagrams of equivalent quantum logic gates in accordance with various embodiments.
Figure 1F:
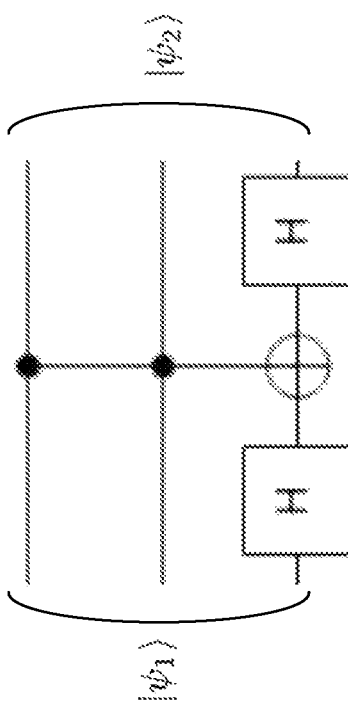
Figure 1H:
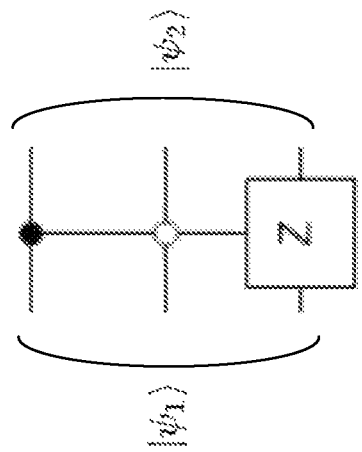
Figure 1G:
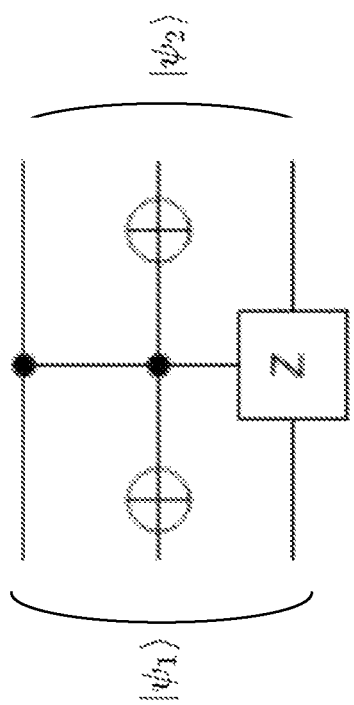

In the same way we may introduce the concept of equivalence between multi-qubit gates. Two n-qubit quantum logic gates can be said to be equivalent if, when used in combination with one or more single qubit gates, they produce the same output vector state in response to a common input vector state. Consider the quantum circuits of FIGS. 1E and 1F. The CCX gate of FIG. 1E conjugated by two Hadamard gates performs the same operation as the CCZ gate of FIG. 1F because HXH=Z and HH=I. The CCZ gate and CCX gate can be considered equivalents of one another for this reason. Consider further the quantum circuits of FIGS. 1G and 1H. Representing an anticontrol as "c", the CCZ gate of FIG. 1G with two additional NOT gates performs the same operation as the CcZ gate of FIG. 1H. The CCZ gate and CcZ gate can be considered equivalents of one another for this reason. For similar reasons, a cCZ gate is also equivalent. More generally, any multi-controlled gate (X, Y, Z, S, H, etc.) is equivalent to a similar gate with one or more anti-control substitutions. As used herein, a gate equivalent of a particular multi-controlled gate includes the multi-controlled gate itself along with all possible multi-gate equivalents to that particular multi-controlled gate. In this fashion, a CCX gate equivalent includes the CCX gate along with all other multi-controlled gates that are equivalent to the CCX gate, (e.g. a cCX gate, CcX gate, ccX gate, CCZ gate, cCZ gate, CcZ gate, ccZ gate, etc.

As discussed above, differing quantum computers may use differing native 2-qubit gates. These native 2-qubit gates can be considered as equivalent to a CNOT gate. Therefore, the number of CNOT gates used in a quantum circuit can be employed as a measure of the efficiency of that particular circuit implementation. The fewer CNOTs—the more efficient the circuit. Furthermore, potential quantum computers with native higher-order multi-qubit gates can be evaluated in a similar fashion.

As used herein a "replacement" quantum logic gate for any particular quantum logic gate can be any other gate that, in response to an input state vector (with or without the aid of one or more ancillas), generates an output state vector that approximates, within an arbitrary precision (e.g. a predetermined or predefined error threshold such as 1%, 5%, 10%, etc.), the output state vector produced by a true/exact implementation of that particular quantum logic gate.

Figure 2A:
FIG. 2A is a schematic block diagram of an embodiment of a quantum logic gate in accordance with various embodiments.

FIG. 2A is a schematic block diagram of an embodiment of a quantum logic gate in accordance with various embodiments. An Adalus gate 112 is presented, the operation of which can be represented by a unitary matrix U. Given a n qubit implementation of the gate, the matrix U is $2^n \times 2^n$. The quantum states that the Adalus gate 112 acts upon are vectors in $2^n$ complex dimensions. The base vectors are the possible outcomes if measured, and a quantum state is a linear combination of these outcomes. While most common quantum gates operate on spaces of one or two qubits, the Adalus gate 112 operates on 3 or more qubits.

In operation, the Adalus gate 112 applies an n−1 qubit controlled X gate function such as CCX, CCCX, . . . to the n qubit input. More generally CCX, CCCX, . . . can be referred to as C*X, $C^m X$ or $C^{n-1}X$ for an n qubit gate input when n−1 control qubits are employed. When n=3, the Adalus gate 112 applies a 2 qubit controlled X gate function to the 3 qubit input—that can be called a controllable-controllable X gate or CCX gate. In particular, the values of 2 qubits are used to determine whether a NOT function is applied to the 3rd or target bit. Representing the values of the first two qubits as "0" and "1", the amplitude of states in which the values of first two qubits are both equal to 1, and the third qubit equal to 0 is swapped with the amplitude of states in which the values of first two qubits are both equal to 1, and the third qubit equal to 1. Other states remain unchanged. This functionality can be represented by the truth table and matrix form presented below.

| Truth table | | | | | | Matrix form |
|---|---|---|---|---|---|---|
| INPUT | | | OUTPUT | | | |
| 0 | 0 | 0 | 0 | 0 | 0 | $\begin{bmatrix} 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 0 & 1 \\ 0 & 0 & 0 & 0 & 0 & 0 & 1 & 0 \end{bmatrix}$ |
| 0 | 0 | 1 | 0 | 0 | 1 | |
| 0 | 1 | 0 | 0 | 1 | 0 | |
| 0 | 1 | 1 | 0 | 1 | 1 | |
| 1 | 0 | 0 | 1 | 0 | 0 | |
| 1 | 0 | 1 | 1 | 0 | 1 | |
| 1 | 1 | 0 | 1 | 1 | 1 | |
| 1 | 1 | 1 | 1 | 1 | 0 | |

In addition to applying an n−1 qubit controlled X gate function, the Adalus gate 112 can apply other matrix functions, such as diagonal matrix functions to the n qubit input. These diagonal matrix functions can be selected as a deterministic function that is selected, for example, to provide a less complex implementation. In any case, the whole Adalus gate can be reversed by applying an adjoint version of the gate. In these cases, the Adalus gate 112 does not strictly implement the C*X gate, but can be considered a replacement for a C*X gate or an approximation of a true/exact C*X gate function that can result in a circuit that is more efficient (e.g., can be implemented in fewer elemental gates such as individual CNOT gates or other elements). For example, the resulting circuit can be considered a replacement to using a true/exact implementation of C*X gate.

For example, when n=4, the Adalus gate 112 applies a 3 qubit controlled X gate function to a target qubit that can be called a controllable-controllable-controllable X gate or CCCX gate that can be represented by the matrix below where empty spaces represent 0's.

$$\begin{bmatrix} 1 & & & & & & & & & & & & & & & \\ & 1 & & & & & & & & & & & & & & \\ & & 1 & & & & & & & & & & & & & \\ & & & 1 & & & & & & & & & & & & \\ & & & & 1 & & & & & & & & & & & \\ & & & & & 1 & & & & & & & & & & \\ & & & & & & 1 & & & & & & & & & \\ & & & & & & & 1 & & & & & & & & \\ & & & & & & & & 1 & & & & & & & \\ & & & & & & & & & 1 & & & & & & \\ & & & & & & & & & & 1 & & & & & \\ & & & & & & & & & & & 1 & & & & \\ & & & & & & & & & & & & 1 & & & \\ & & & & & & & & & & & & & 1 & & \\ & & & & & & & & & & & & & & & 1 \\ & & & & & & & & & & & & & & 1 & \end{bmatrix}$$

In addition to applying an CCCX gate function, the Adalus gate 112 can apply a diagonal matrix function that changes one or more phases of the 4 qubit input. An example matrix function is presented below:

The resulting unitary for the 4 qubit Adalus gate 112 can be found from the product of the two matrices above and can be represented by:

$$\begin{bmatrix} 1 & & & & & & & & & & & & & & & \\ & 1 & & & & & & & & & & & & & & \\ & & 1 & & & & & & & & & & & & & \\ & & & 1 & & & & & & & & & & & & \\ & & & & 1 & & & & & & & & & & & \\ & & & & & 1 & & & & & & & & & & \\ & & & & & & -i & & & & & & & & & \\ & & & & & & & i & & & & & & & & \\ & & & & & & & & 1 & & & & & & & \\ & & & & & & & & & 1 & & & & & & \\ & & & & & & & & & & 1 & & & & & \\ & & & & & & & & & & & 1 & & & & \\ & & & & & & & & & & & & 1 & & & \\ & & & & & & & & & & & & & 1 & & \\ & & & & & & & & & & & & & & -i & \\ & & & & & & & & & & & & & & & -i \end{bmatrix}$$

When n=5, the Adalus gate 112 applies a 4 qubit controlled X gate function to a target qubit that can be called a controllable-controllable-controllable-controllable X gate or CCCCX gate, etc. In addition to applying an $C^4X$ gate function, the Adalus gate 112 can apply one or more diagonal matrix functions. Similarly, a n-qubit Adalus gate 112 can be said to apply an $C^{n-1}X$ gate function and one or more diagonal matrix functions, to the n qubit input with n−1 control qubits and one target (controlled) qubit.

Figure 2B:
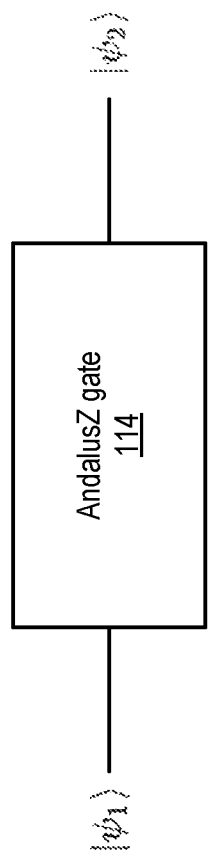
FIG. 2B is a schematic block diagram of an embodiment of a quantum logic gate in accordance with various embodiments.

FIG. 2B is a schematic block diagram of an embodiment of a quantum logic gate in accordance with various embodiments. An AdalusZ gate 114 is presented, the operation of which can be represented by its own unitary matrix U. The AdalusZ gate 114 implements a n−1 qubit controlled Z gate function on the n qubit input. It is represented by a diagonal matrix that has exactly one −1 on the diagonal with the other diagonal elements being 1. In addition, the AdalusZ gate 114 can apply another unitary matrix to the n qubit input that applies a permutation to the state vector. The combination of n−1 qubit controlled Z gate function and permutation generates a unitary matrix of AdalusZ gate 114, that might (in some situations) be used in place of a C*Z gate. The C*Z portion of AdalusZ gate 114 is controlled by n−1 control qubits. The AdalusZ gate 114 can be said to also apply a $cC^{n-2}X$ gate function to the n qubit input with one target qubit and n−1 control qubits (e.g., n−2 control qubits active on "1" and one control qubit active on "0").

When n=3, the AdalusZ gate 114 applies a 2 qubit controlled Z gate function to the 3 qubit input along with a permutation function—that has the effect of a cCX gate. In particular, the values of 2 qubits are used to determine whether a phase flip (or pi radian phase shift along the z-axis of the Bloch sphere) function is applied to the 3rd or target bit. Representing the values of the two qubits as "0" and "1", if first two qubits are in state "1"—then a phase flip is applied. Additionally if control qubit has the state "1" and anti-control has the state "0"—then NOT is applied to the 3rd qubit.

Figure 2C:
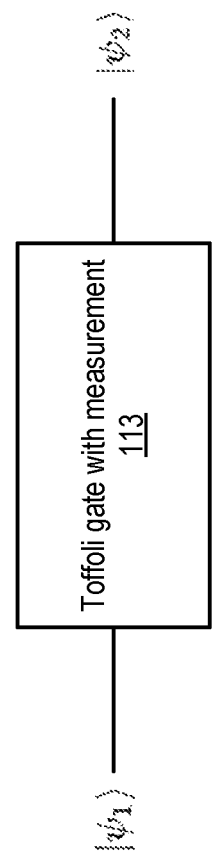
FIG. 2C is a schematic block diagram of an embodiment of a quantum logic gate in accordance with various embodiments.

FIG. 2C is a schematic block diagram of an embodiment of a quantum logic gate in accordance with various embodiments. A Toffoli gate with measurement 113 is presented, the operation of which can be represented by its own diagonal matrix or other unitary matrix U. In operation, the Toffoli gate with measurement 113 uses one or more ancilla qubits and one or more measurements to apply a C*Z gate function to an n qubit input. For example, the Toffoli gate with measurement 113 implements a reversable n−1 qubit controlled Z gate function ($C^{n-1}Z$) on the n qubit input, using the ancilla bits and measurement(s) of the ancilla bit(s) that are irreversible.

In various embodiments, a Toffoli gate with measurement 113 includes a plurality of leading gates that operate on the ancilla qubit(s) to generate ancilla qubit state(s) in response each of the n qubits and an initial state of the ancilla bit(s). A measurement operates on the ancilla qubit state(s) to generate a classical ancilla bit state(s). At least one following gate operates under control of the classical ancilla bit state and optionally under control of at least one of the n qubits. The following gates can include one or more controlled Z gates that to selectively apply a phase flip to one or more corresponding qubits of the n qubits. These following C*Z gates are conditioned on the measurement result and are only executed if the measurement result is 0 or 1 (depending on whether these gates are controlled or anti-controlled based on the classical ancilla bit state). Their effective cost can be multiplied by the probability of running them (as the measurement result may or may not force the circuit to perform their respective function(s)). Following gates can be run (or not) conditioned on the respective probabilities of measuring 0 and 1—which can be equal to 12 or some other probability value, based on the problem being solved. In addition, other following gates can be included with corresponding functions that are performed unconditionally. Furthermore, implementations of C*Z functions with larger values of n can recursively utilize lower order C*Z implementations on a smaller number of controlling qubits after measurement(s).

Traditional Toffoli gate implementations of $C^{n-1}Z$ fundamentally require a number of CNOT operations (actual or equivalent), when the function of each of the component gates are deconstructed and implemented via a quantum computer. The state of the art for the CCZ, CCCZ, CCCCZ, CCCCCZ gates without any ancilla is 6, 14, 30, 62, CNOTs respectively while with one ancilla it is respectively, 6, 12, 18, 26 CNOTs. The use of the ancilla(s) and measurements(s) in the Toffoli gate with measurement 113 reduces the number of gate operations in the implementation, particularly the number of equivalent CNOT gate operations for computers which allow for mid-circuit measurement and that allow reuse of the measured qubit in further computations by additional gates of the circuit. The table below presents the extent of the reduction.

| Gate | Best | Average | Worst |
|---|---|---|---|
| CCZ | 4 | 4.5 | 5 |
| CCCZ | 7 | 7 | 7 |
| CCCCZ | 11 | 12.5 | 14 |
| CCCCCZ | 16 | 18 | 20 |

As shown above, the Toffoli gate with measurement 113, for example, can implement a CCCZ function with only 7 CNOT gate operations on average and 8 in the worst case, and a CCCCZ function with 12.5 CNOT gate operations on average and 14 only in the worst case. As a consequence, the Toffoli gate with measurement 113 improves the technology of quantum logic gates via an implementation that is faster and less error prone than exact implementations of C*Z— because fewer gate operations may be employed.

Figure 3A:
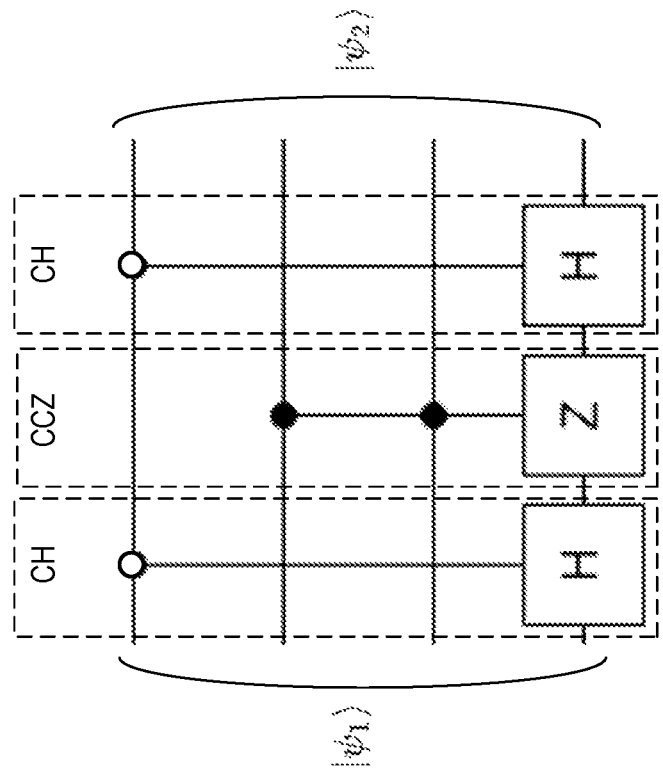
FIG. 3A is a schematic block diagram of an embodiment of a quantum logic gate in accordance with various embodiments.

FIG. 3A is a schematic block diagram of an embodiment of a quantum logic gate in accordance with various embodiments. In particular, a circuit implementation of Adalus gate 112 is shown that implements a replacement for a 4 qubit controlled X gate function ($C^4X$ or CCCCX) on 5 qubits. The Adalus gate 112 includes a controlled-controlled rotation around the Z axis in the Bloch sphere that selectively applies, under control of the $3^{rd}$ and 4th qubits from the top (comprising a first subset of the 5 qubits), a pi radian Z-axis Bloch sphere rotation to a bottom (target) qubit of the 5 qubits. A pair of controlled Hadamard (CCH) gates selectively conjugate the target qubit under control of a second subset of the 5 qubits that comprises the remaining 2 qubits.

In the example shown, elements of the first subset are mutually exclusive of elements the second subset. In particular, the first subset includes two qubits and the second subset includes two qubits that are different from the two qubits of the first subset. Furthermore, the elements of the first subset, the elements the second subset and the target qubit collectively span the n qubits of the input and output.

The Adalus gate 112 improves the technology of quantum circuits by providing a scalable methodology for replacing C*X gates without the use of ancillas and without mid-circuit measurement. In particular, a greater number of qubits can be implemented in this design by increasing the number of CCRz(pi) gates and CCH pairs and/or using higher order control for the Rz(pi) and H gates. While an implementation is shown that does not require any ancillas, implementations with 1 or more ancillas are likewise possible.

Figure 3B:
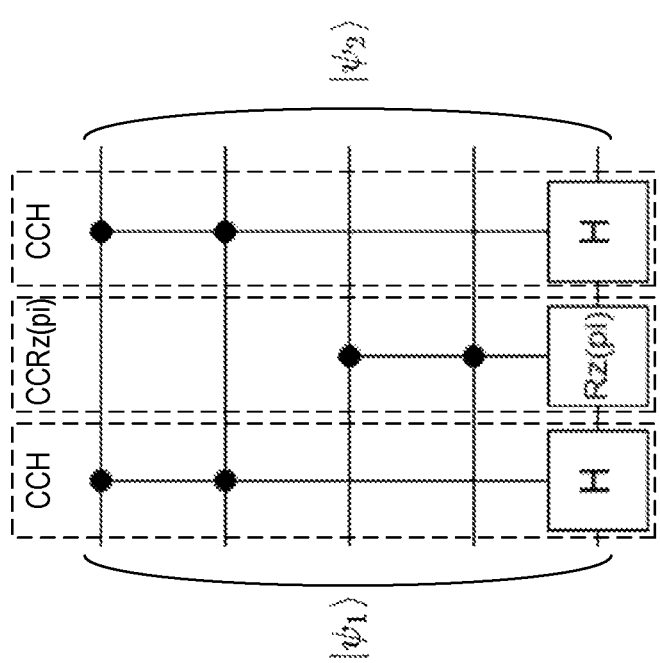
FIG. 3B is a schematic block diagram of an embodiment of a quantum logic gate in accordance with various embodiments.

FIG. 3B is a schematic block diagram of an embodiment of a quantum logic gate in accordance with various embodiments. In particular, a circuit implementation of AdalusZ gate 114 is shown that provides a replacement for a 3 qubit controlled Z gate function (CCCZ) on 4 qubits. The AdalusZ gate 114 includes a controlled Z (CCZ) gate that selectively applies, under control of the $2^{nd}$ and $3^{rd}$ qubits from the top (comprising a subset of the 4 qubits), a phase flip to a bottom (target) qubit of the 4 qubits. A pair of anti-controlled Hadamard (cH) gates selectively conjugate the target qubit under control of another qubit. As used herein, the term "phase flip" can be equated to a phase reversal.

In the example shown, elements of the subset are mutually exclusive of the other qubit used to control Hadamard gates. The elements of the subset, the other qubit used to control Hadamard gates and the target qubit collectively span the n qubits of the input and output.

The AdalusZ gate 114 improves the technology of quantum circuits by providing a scalable methodology for approximating C*Z gates without ancillas and without mid-circuit measurement. The AdalusZ gate 114 is faster and uses fewer basic gates than an exact implementation of C*Z. A greater number of qubits can be implemented in this design by increasing the number of CCZ gates and cH pairs and/or using higher order control/anti-control for the Rz(pi) and H gates. While an implementation is shown that does not require any ancillas, implementations with 1 or more ancillas are likewise possible. The AdalusZ gate 114 can be implemented as a diffusor in a circuit implementation of Grover's Algorithm, other amplitude amplifying algorithm and/or other quantum solutions.

As can be seen in FIGS. 3A and 3B, the example implementations of Adalus gate 112 and AdalusZ gate 114 depend on implementing other (smaller) multi-controlled C*X, C*Rz, C*H gates. While these gates are shown as being implemented using no ancillas, the implementations of one or more of these multi-controlled gates may well benefit from using additional ancilla bits. These ancilla qubits may or may not be initialized to the zero state, may or may not be used in conjunction with a mid-circuit measurement, may or may not be entangled with the rest of the system, and may or may not be the subject of loosened or more restricted requirements (see, e.g. Constructing Large Controlled Nots, Jun. 5, 2015, https://algassert.com/circuits/2015/06/05/Constructing-Large-Controlled-Nots.html).

In general, other circuit implementations of the Adalus gate 112 and AdalusZ gate 114 are likewise possible. In particular, one or more of the following adjustments, permutations and modifications can be applied to generate equivalent gates/circuits:
  wires can be swapped,
  gates rearranged,
  angles adjusted,
  changing anti-controls into controls,
  basis change (CX inversion or other),
  commutation,
  commutation with alteration,
  commutation of larger blocks of gates,
  adding dummy controls,
  adding dummy conditions,
  adding identities,
  merging gates,
  dividing gates,
  diagonal gates retargeting,
  etc.

Figure 4:
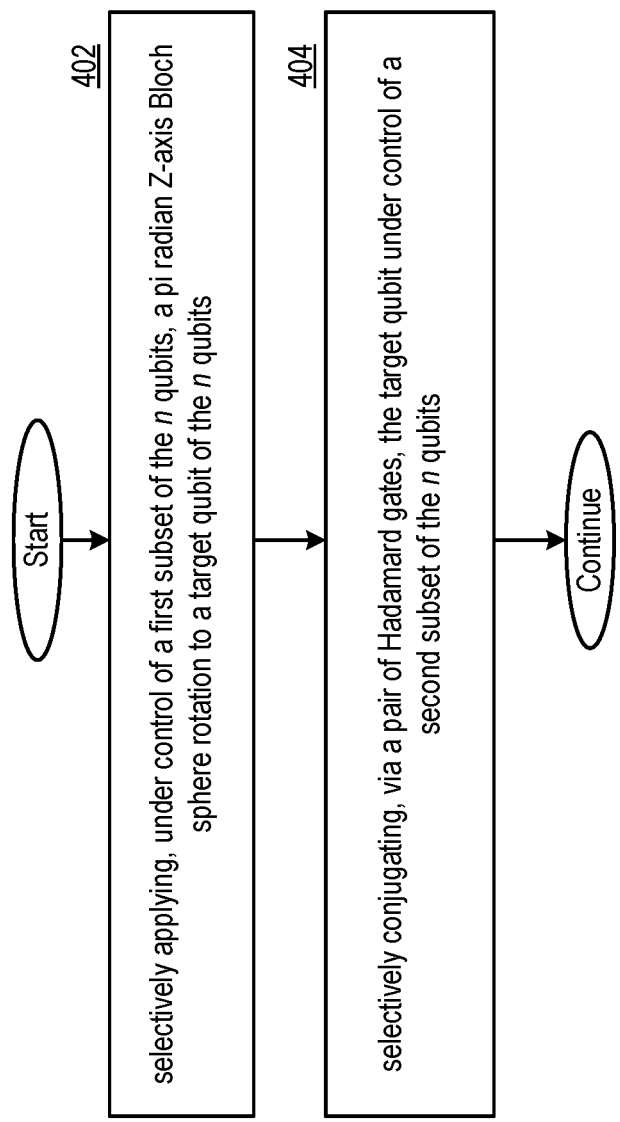
FIG. 4 is a flow diagram of an embodiment of a method in accordance with the present invention.

FIG. 4 is a flow diagram of an embodiment of a method in accordance with the present invention. In particular, a method is presented for use with one or more functions and features described in conjunctions with FIGS. 1-3. Step 402 includes selectively applying, under control of a first subset of the n qubits, a pi radian Z-axis Bloch sphere rotation to a target qubit of the n qubits. Step 404 includes selectively conjugating, via a pair of Hadamard gates, the target qubit under control of a second subset of the n qubits.

In various embodiments, elements of the first subset of the n qubits are mutually exclusive of elements the second subset of the n qubits. The first subset of the n qubits and the second subset of the n qubits can be each non-zero proper subsets of the n qubits. A union of the first subset and the second subset can consist of n−1 qubits of the n qubits. The elements of the first subset of the n qubits, the elements the second subset of the n qubits and the target qubit can collectively span the n qubits. When n=5, and the first subset of the n qubits can include two qubits and the second subset of the n qubits can include two qubits that are different from the two qubits of the first subset. When n=4, and the first subset of the n qubits can include two qubits and the second subset of the n qubits can include a qubit that is different from the two qubits of the first subset.

Figure 5:
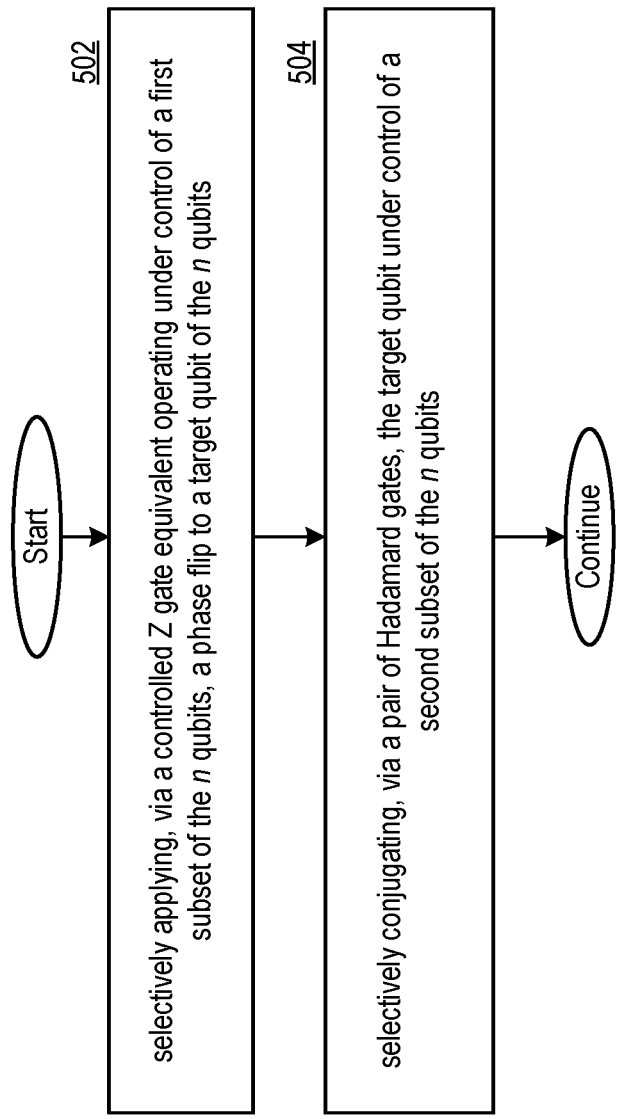
FIG. 5 is a flow diagram of an embodiment of a method in accordance with the present invention.

FIG. 5 is a flow diagram of an embodiment of a method in accordance with the present invention. In particular, a method is presented for use with one or more functions and features described in conjunctions with FIGS. 1-4. Step 502 includes selectively applying, via a controlled Z gate equivalent operating under control of a first subset of the n qubits, a phase flip to a target qubit of the n qubits. Step 504 includes selectively conjugating, via a pair of Hadamard gates, the target qubit under control of a second subset of the n qubits.

In various embodiments, elements of the first subset of the n qubits are mutually exclusive of elements the second subset of the n qubits. The first subset of the n qubits and the second subset of the n qubits can be each non-zero proper subsets of the n qubits. A union of the first subset and the second subset can consist of n−1 qubits of the n qubits. The elements of the first subset of the n qubits, the elements the second subset of the n qubits and the target qubit can collectively span the n qubits. When n=5, and the first subset of the n qubits can include two qubits and the second subset of the n qubits can include two qubits that are different from the two qubits of the first subset. When n=4, and the first subset of the n qubits can include two qubits and the second subset of the n qubits can include a qubit that is different from the two qubits of the first subset.

Figure 6A:
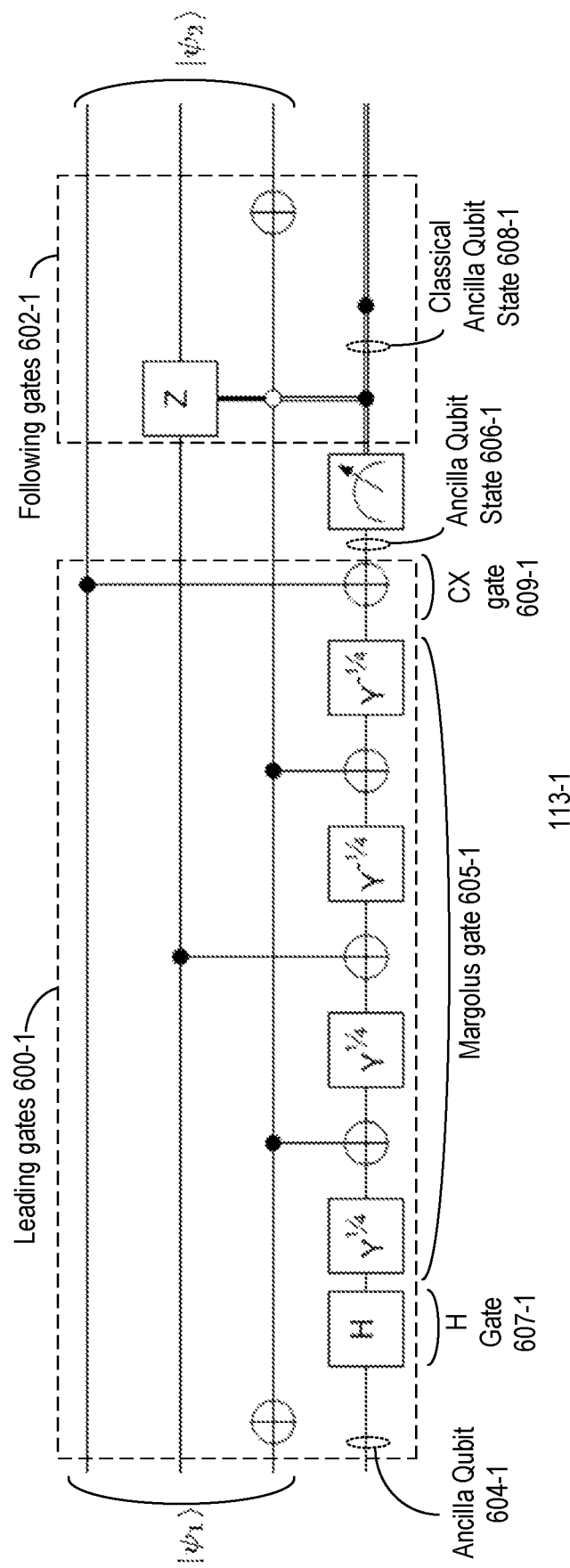
FIG. 6A is a schematic block diagram of an embodiment of a quantum logic gate in accordance with various embodiments.

FIG. 6A is a schematic block diagram of an embodiment of a quantum logic gate in accordance with various embodiments. In particular, a Toffoli gate with measurement 113-1 is shown that implements an n−1 qubit controlled Z gate function (CCZ) based on n qubits and an ancilla qubit, where n=3. The Toffoli gate with measurement 113-1 includes a plurality of leading gates 600-1 that operate on the ancilla qubit 604-1 to generate a ancilla qubit state 606-1 in response to an initial state of the ancilla bit 604-1 (e.g. "0") and each of the 3 qubits. A measurement operates on the ancilla qubit state 606-1 to generate a classical ancilla bit state 608-1 that is either 0 or 1. The following gates 602-1 include a controlled Z gate that operates under control of the bottom-most qubit and further under control of the classical ancilla bit state 608-1 to selectively apply a phase flip to the second qubit from the top.

In the example shown, the leading gates 600-1 include a Hadamard gate 607-1, a number of fractional Y gates raised to a fractional power (¼ or −¼ in the example shown) that apply a partial rotation about the y-axis and a number of CX (CNOT) gates that all operate on the ancilla qubit 604-1. CX gates separate each of the fractional Y gates and are controlled by corresponding ones of the n qubits forming a Margolus gate 605-1. An additional CX gate 609-1 is included after the fractional Y gates bringing the number of CX gates to four. NOTs on the beginning and end of the circuit are included to exactly match the functionality of a CCCZ gate. However, changing relevant gates to be controlled on "0" state (denoted by white circle), not on "1" state (denoted by black circle) can be used interchangeably with the use of these NOTs.

Figure 6B:
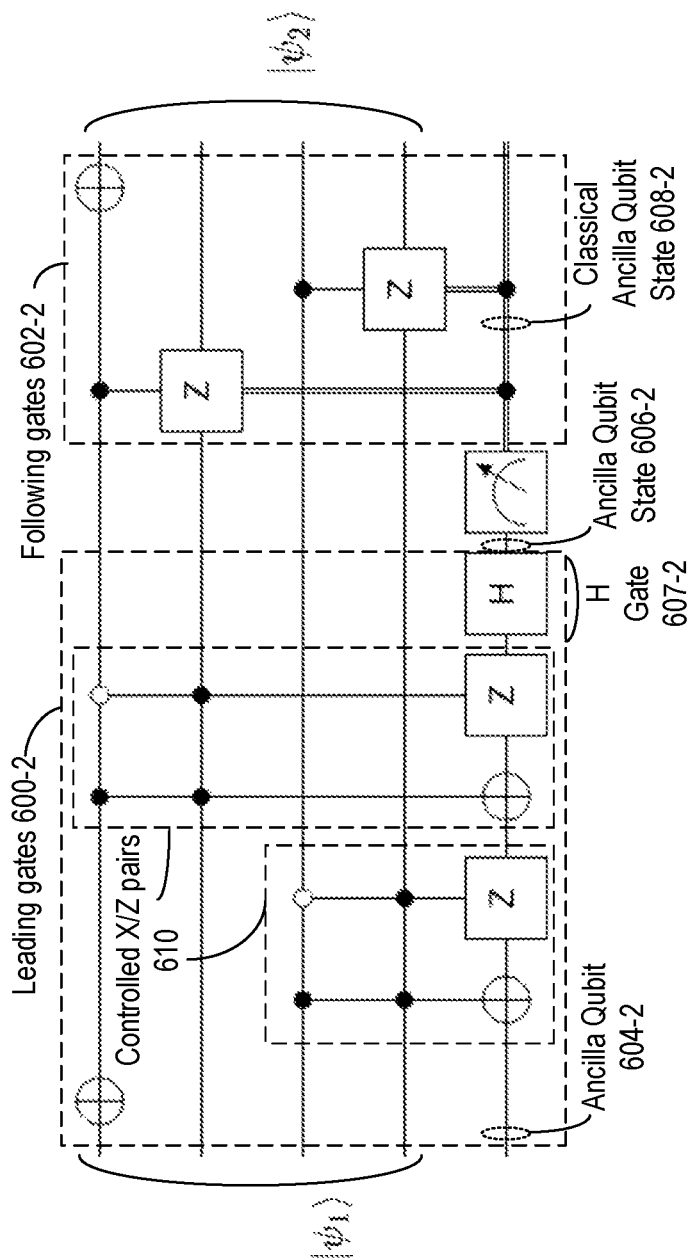
FIG. 6B is a schematic block diagram of an embodiment of a quantum logic gate in accordance with various embodiments.

FIG. 6B is a schematic block diagram of an embodiment of a quantum logic gate in accordance with various embodiments. In particular, a Toffoli gate with measurement 113-2 is shown that implements an n−1 qubit controlled Z gate function (CCCZ) based on n qubits and an ancilla qubit, where n=4. The Toffoli gate with measurement 113-2 includes a plurality of leading gates 600-2 that operate on the ancilla qubit 604-2 to generate a ancilla qubit state 606-2 in response to an initial state of the ancilla bit 604-2 (e.g. "0") and each of the 4 qubits. A measurement operates on the ancilla qubit state 606-2 to generate a classical ancilla bit state 608-2. The leading gates include a Hadamard gate 607-2 and a sequence of controlled X gate/Z gate pairs 610 that operate on the ancilla qubit 604-2. Consider the set of n qubits to be numbered with ascending integers with "1" as the topmost and "4" as the bottom-most. The sequence of controlled X gate/Z gate pairs 610 are controlled (or anti-controlled) by corresponding two disjoint subsets ({1, 2} and {3, 4}) of the set of n qubits {1, 2, 3, 4}. Furthermore, in the example shown, each of the controlled X gate/Z gate pairs 610 can be implemented via a corresponding Margolus gate.

The following gates 602-2 include a plurality of controlled Z gates that operate under control of differing ones of the n qubits "1" and "3" and further under control of the classical ancilla bit state 608-2 to selectively apply a phase flip to a subset of the n qubits (the second and/or fourth from the top respectively). As shown, the differing ones of then qubits "1" and "3" are not included in the subset of the n qubits {2, 4}.

While specific quantum circuit implementations of the Toffoli gate with measurement 113 have been presented, other implementations are likewise possible. Because of symmetries one or more of the following adjustments, permutations and modifications can be applied to generate equivalent gates:

- Wires can be swapped—in circuit descriptions qubits are presented in a specified order. However, depending on the target topology, their arrangement can be different and Swap operations could be used to change the ordering.
- Angles adjusted—small change in angles of parametric gates (e.g. rotation) may result in small disturbance of the circuit's measurement probabilities—therefore the modified circuit could still be usable for the same purpose as the original one.
- Changing anti-controls into controls—whenever there is a gate controlled on a qubit q, it can be replaced with the same gate but anti-controlled on a qubit q, that is both preceded and succeeded by a Not gate on the q qubit.
- Basis change—some multi-qubit gates can be replaced with others as a result of a basis change. For instance, if there is a Cnot gate controlled on qubit c and targeted on qubit t; an equivalent circuit can be obtained by applying Hadamard gates both on c and t, then Cnot controlled on qubit t and targeted on qubit c, and then again Hadamard gates on c and t.
- Commutation—we can say that some gates commute if the order of their application does produce the same outcome, so such gates can be swapped to produce equivalent circuit.
- Commutation with alteration—one may run the similar procedure of commutation that changes the order of gates, but requires modifying one or both of them. For example, a circuit consisting of Cnot controlled on qubit c and targeted on qubit t, followed by a Hadamard gate on qubit t might be replaced with Hadamard gate on qubit t, followed by Controlled Z rotation, controlled on qubit c and targeted on qubit t.
- Commutation of larger blocks of gates—this can be the same as commutation but treating a subcircuit as one gate.
- Adding dummy controls—replace a gate by the same one in two copies: first controlled on some qubit q, and then anti-controlled on the same qubit q. This can result in the same outcome. Usually we do control that qubit q on two states forming the measurement Z base, but any other base is likewise possible.

Adding dummy conditions—replace a gate by the same one, but in two copies: first conditioned on a classical bit c, and then anti-conditioned on the same classical bit c. This can be an equivalent circuit.

Identities—when in any place an identity gate is added (or removed), this results in an equivalent circuit.

Merging gates—a sequence of two or more gates could be equivalently expressed as an application of one gate.

Dividing (decomposing) gates—one gate could be equivalently expressed as the application of two or more gates. Including decomposition of Identity, that can be split, e.g. into two Not gates.

Diagonal gates retargeting—in case of diagonal gates that are symmetric with respect to the qubits it affects, we might denote them as (multi-)controlled Z rotations, but the meaning of target and control qubit is interchangeable here, so that e.g. a CZ Gate controlled on 1st qubit with target on 2nd qubit is equivalent to CZ Gate controlled on 2nd qubit with target on 1st qubit.

An example principle for implementing a Toffoli gate with measurement 113 can be explained as follows:

1) Prepare/obtain/use ancilla qubit in an initial state. In the quantum computing literature ancilla is usually assumed to be 10>, but other initial states can be applied in other implementations
2) Divide input n-qubits into two subsets
3) Apply a gate similar to CCC . . . CNOT, (it could be Adalus gate, Margolus gate for 3-qubit gate, another equivalent gate or an exact C*X)—it may differ multiplicatively by some diagonal unitary matrix and all the controls are on the first subset of qubits that we obtained in (2)
4) Apply a Hadamard gate on the ancilla qubit
5) Apply another CCC . . . NOT similar gate as explained in 3) but this time control on the second subset of qubits obtained in (2)
6) Apply a measurement
7) Depending on the results of the measurement, use following gates 602 to conditionally adjust phases on one or more of the n-qubits. The exact procedure of adjustment is dependent on the C*X-like gate used in the leading gates 600 (i.e. (3) & (5)).

For Adalus gate implementations the phase adjustment will be anti-conditioned C*S, and conditioned C*Rz(pi); for Margolus gate implementations the phase adjustment is just conditioned CZ).

Further quantum circuit implementations of the Toffoli gate with measurement 113 are presented in conjunction with the examples of FIGS. 6C-6F.

Figure 6C:
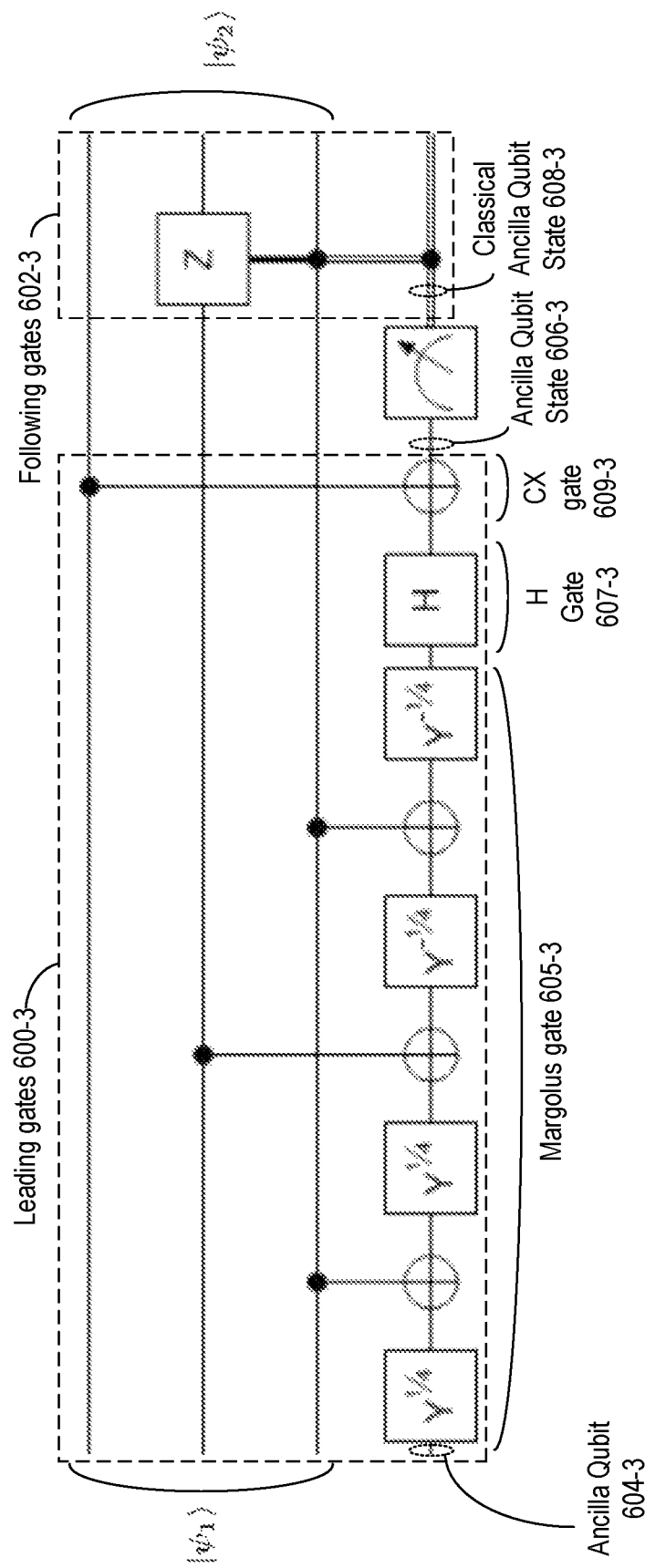
FIG. 6C is a schematic block diagram of an embodiment of a quantum logic gate in accordance with various embodiments.

FIG. 6C is a schematic block diagram of an embodiment of a quantum logic gate in accordance with various embodiments. In particular, a Toffoli gate with measurement 113-1 is shown that implements an n−1 qubit controlled Z gate function (CCZ) based on n qubits and an ancilla qubit, where n=3. The Toffoli gate with measurement 113-1 includes a plurality of leading gates 600-3 that operate on the ancilla qubit 604-3 to generate a ancilla qubit state 606-3 in response to an initial state of the ancilla bit 604-3 (e.g. "0") and each of the 3 qubits. A measurement operates on the ancilla qubit state 606-3 to generate a classical ancilla bit state 608-3 that is either 0 or 1. The following gates 603-1 include a controlled Z gate that operates under control of the bottom-most qubit and further under control of the classical ancilla bit state 608-3 to selectively apply a phase flip to the second qubit from the top.

In the example shown, the leading gates 600-3 include a Hadamard gate 607-3 and a Margolus gate 605-3. An additional CX gate 609-3 is included after the Margolus gate 605-3 bringing the number of CX gates to four.

Figure 6D:
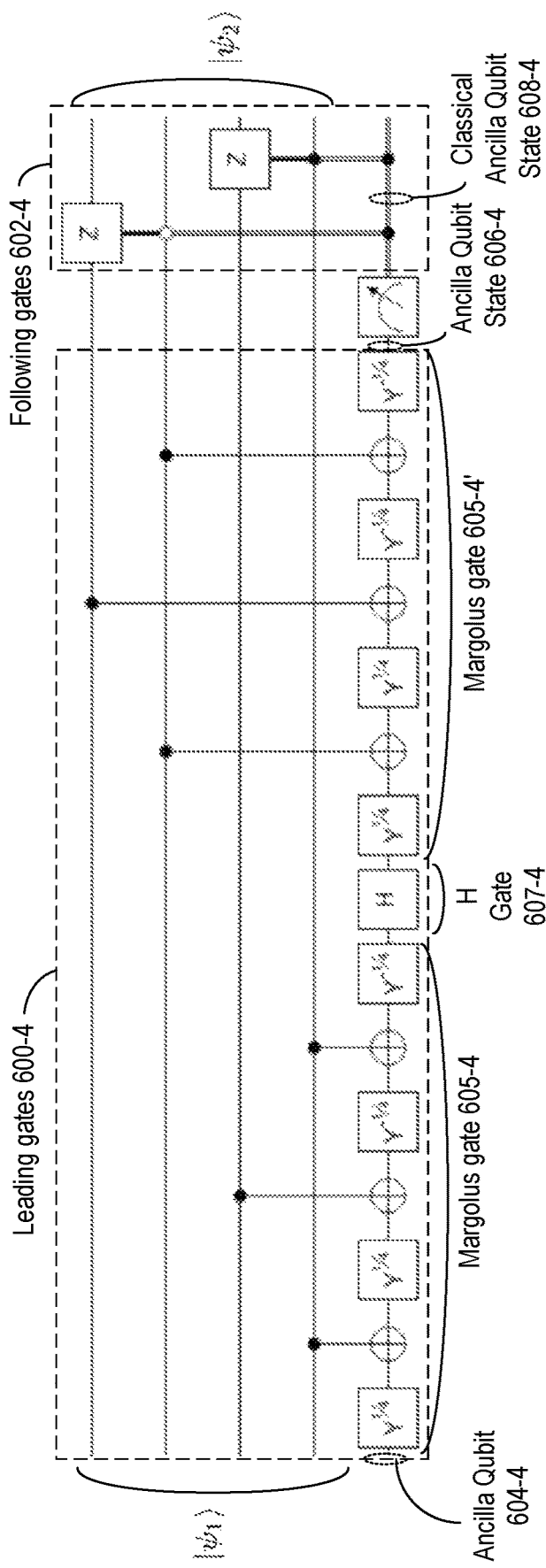
FIG. 6D is a schematic block diagram of an embodiment of a quantum logic gate in accordance with various embodiments.

FIG. 6D is a schematic block diagram of an embodiment of a quantum logic gate in accordance with various embodiments. In particular, a Toffoli gate with measurement 113-4 is shown that implements an n−1 qubit controlled Z gate function (CCCZ) based on n qubits and an ancilla qubit, where n=4. The Toffoli gate with measurement 113-4 includes a plurality of leading gates 600-4 that operate on the ancilla qubit 604-4 to generate a ancilla qubit state 606-4 in response to an initial state of the ancilla bit 604-4 (e.g. "0") and each of the 4 qubits. A measurement operates on the ancilla qubit state 606-4 to generate a classical ancilla bit state 608-4. The leading gates include a Hadamard gate 607-4 and a pair of Margolus gates 605-4 and 605-4' that operate on different subsets of the 4 qubits.

The following gates 602-4 include a plurality of controlled Z gates that operate under control/anti-control of differing ones of the n qubits "2" and "4" and further under control of the classical ancilla bit state 608-4 to selectively apply a phase flip to a subset of the n qubits (the first and third from the top respectively).

Figure 6E:
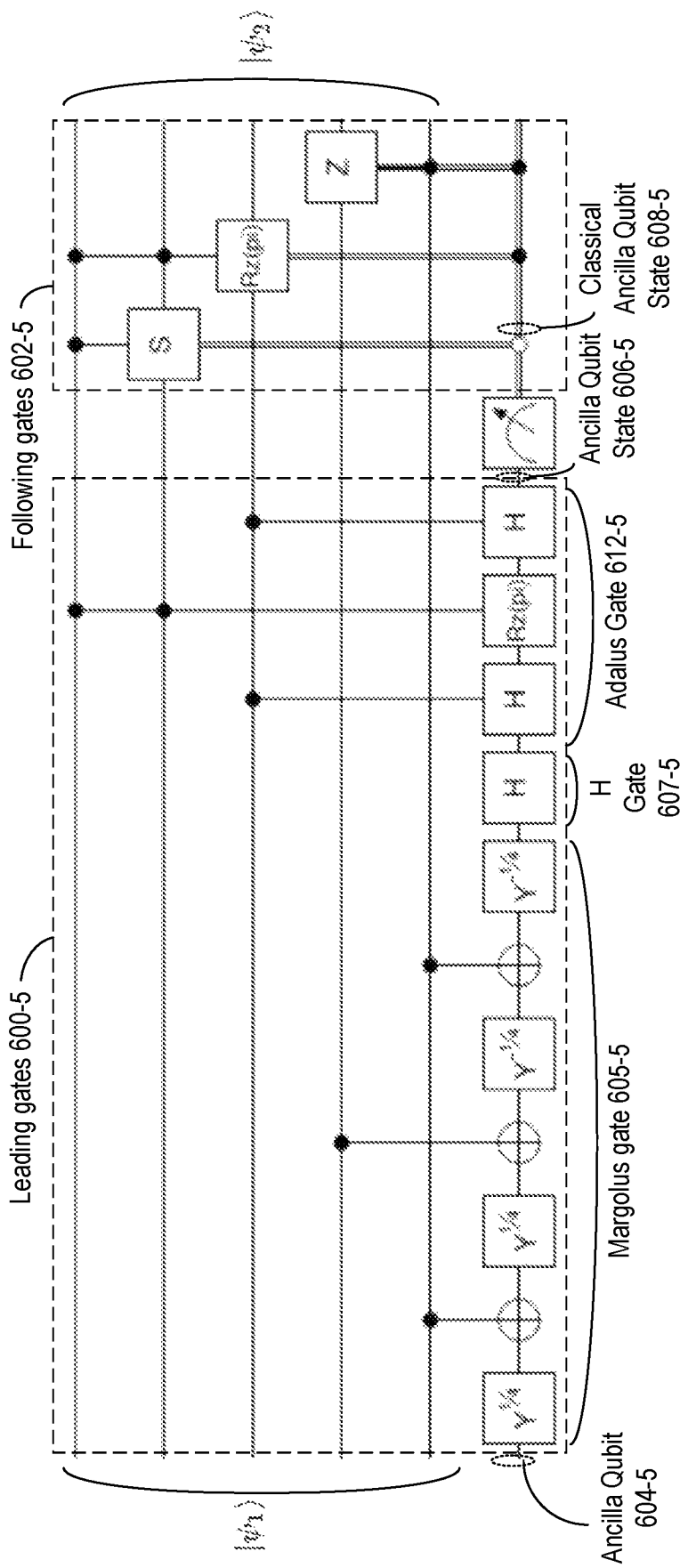
FIG. 6E is a schematic block diagram of an embodiment of a quantum logic gate in accordance with various embodiments.

FIG. 6E is a schematic block diagram of an embodiment of a quantum logic gate in accordance with various embodiments. In particular, a Toffoli gate with measurement 113-5 is shown that implements an n−1 qubit controlled Z gate function (CCCCZ) based on n qubits and an ancilla qubit, where n=5. The Toffoli gate with measurement 113-5 includes a plurality of leading gates 600-5 that operate on the ancilla qubit 604-5 to generate a ancilla qubit state 606-5 in response to an initial state of the ancilla bit 604-5 (e.g. "0") and each of the 5 qubits. A measurement operates on the ancilla qubit state 606-5 to generate a classical ancilla bit state 608-5.

The phase adjustments applied by the following gates 602-5 include a controlled Z gate that operates under control of the bottom-most qubit and further under control of the classical ancilla bit state 608-5 to selectively apply a phase flip to the second qubit from the top, a controlled S gate that operates on qubit "2" under control of qubit "1" and further under anticontrol of the classical ancilla bit state 608-5 and a controlled Rz(pi) gate that operates on qubit "3" under control of qubits "1" and "2" and further under control of the classical ancilla bit state 608-5. In the example shown, the leading gates 600-5 include a Hadamard gate 607-5, a Margolus gate 605-5 that operates under control of qubits "4" and "5" and an Adalus Gate 612-5 that operates under control of qubits "1", "2" and "3".

Figure 6F:
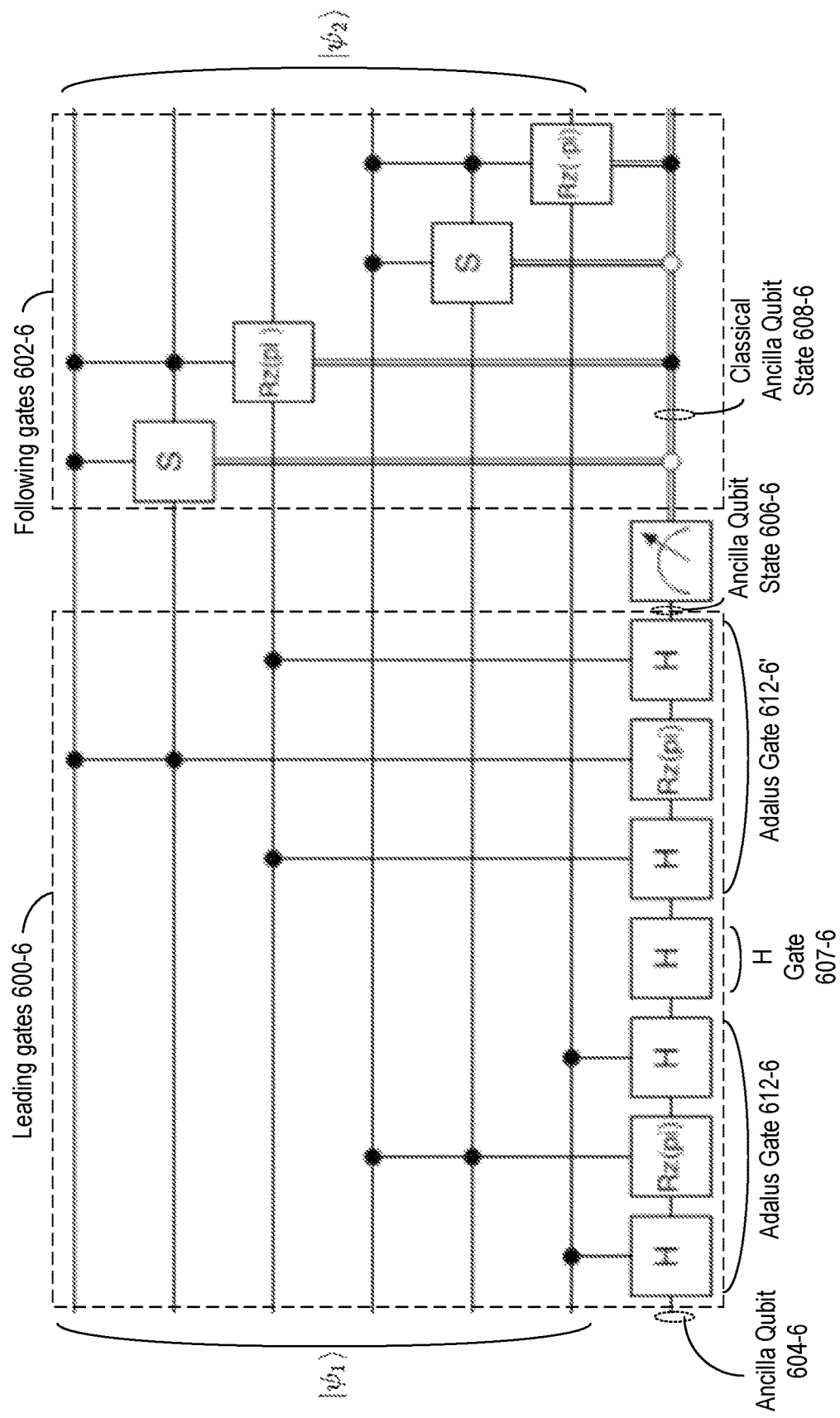
FIG. 6F is a schematic block diagram of an embodiment of a quantum logic gate in accordance with various embodiments.

FIG. 6F is a schematic block diagram of an embodiment of a quantum logic gate in accordance with various embodiments. In particular, a Toffoli gate with measurement 113-6 is shown that implements an n−1 qubit controlled Z gate function (CCCCCZ) based on n qubits and an ancilla qubit, where n=6. The Toffoli gate with measurement 113-6 includes a plurality of leading gates 600-6 that operate on the ancilla qubit 604-6 to generate a ancilla qubit state 606-6 in response to an initial state of the ancilla bit 604-6 (e.g. "0") and each of the 6 qubits. A measurement operates on the ancilla qubit state 606-6 to generate a classical ancilla bit state 608-6.

The phase adjustments applied by the following gates 602-5 include a controlled S gate that operates on qubit "2"

under control of qubit "1" and further under anticontrol of the classical ancilla bit state 608-5, a controlled Rz(pi) gate that operates on qubit "3" under control of qubits "1" and "2" and further under control of the classical ancilla bit state 608-5, a controlled S gate that operates on qubit "5" under control of qubit "4" and further under anticontrol of the classical ancilla bit state 608-5, and a controlled Rz(pi) gate that operates on qubit "6" under control of qubits "4" and "5" and further under control of the classical ancilla bit state 608-5. In the example shown, the leading gates 600-5 include a Hadamard gate 607-6 and a pair of Adalus gates 612-6 and 612-6' that operates under control of differing subsets of the 6 qubits.

Figure 7:
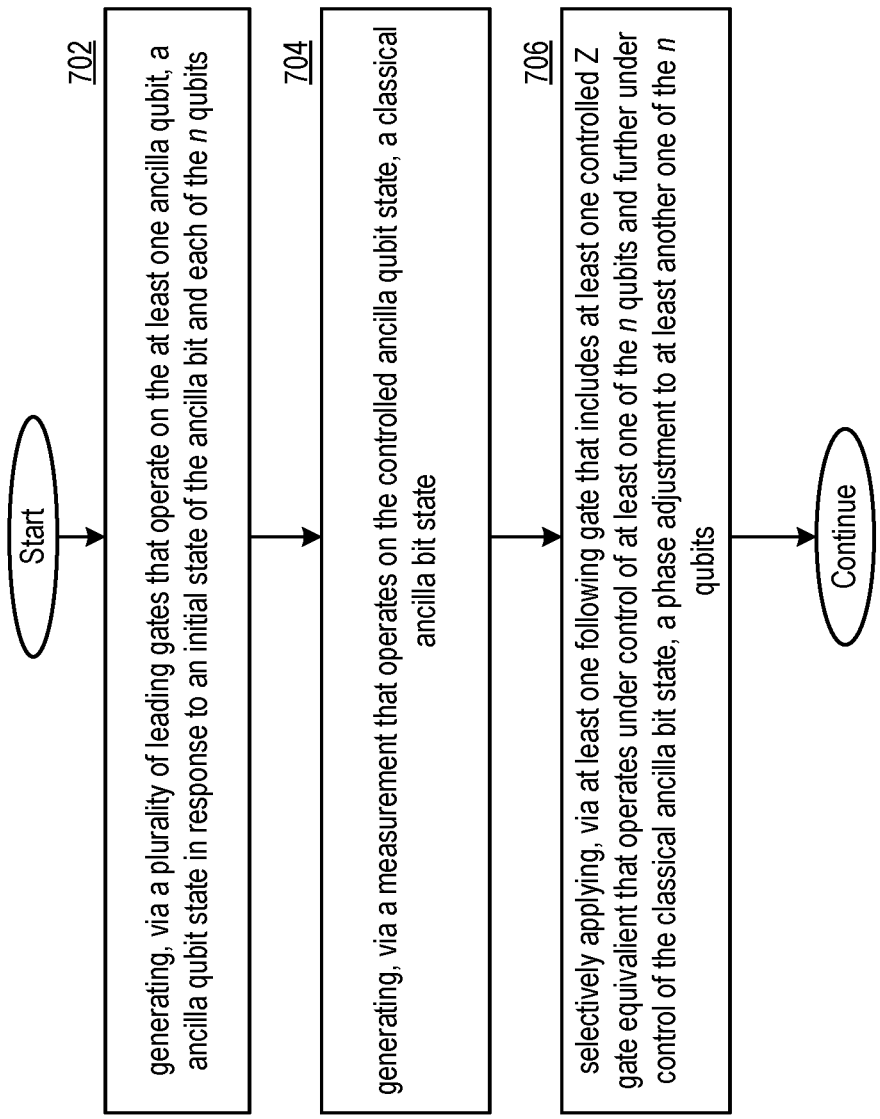
FIG. 7 is a flow diagram of an embodiment of a method in accordance with the present invention.

FIG. 7 is a flow diagram of an embodiment of a method in accordance with the present invention. In particular, a method is presented for use with one or more functions and features described in conjunctions with FIGS. 1-6. Step 702 includes generating, via a plurality of leading gates that operate on the at least one ancilla qubit, a controlled ancilla qubit state in response to an initial state of the ancilla bit and each of the n qubits. Step 704 includes generating, via a measurement that operates on the controlled ancilla qubit state, a classical ancilla bit state. Step 706 includes selectively applying, via at least one following gate that includes at least one controlled Z gate that operates under control of at least one of the n qubits and further under control of the classical ancilla bit state, a phase flip to at least another one of the n qubits.

In various embodiments, the plurality of leading gates and the at least one following gates minimize an average number of CNOT operations. The plurality of leading gates can include: at least one Hadamard gate; and a first Margolus gate that operates on the at least one ancilla qubit, wherein the first Margolus gate is controlled by a first subset of the n qubits. The plurality of leading gates can further include: a second Margolus gate that operates on the at least one ancilla qubit, wherein the first Margolus gate is controlled by a second subset of the n qubits that is disjoint from the first subset. The plurality of leading gates can further include: an Adalus gate that operates on the at least one ancilla qubit, wherein the Adalus gate is controlled by a second subset of the n qubits that is disjoint from the first subset.

In various embodiments, the plurality of leading gates include: at least one Hadamard gate; and a first Adalus gate that operates on the at least one ancilla qubit, wherein the first Adalus gate is controlled by a first subset of the n qubits. The plurality of leading gates can further include:
  a second Adalus gate that operates on the at least one ancilla qubit, wherein the second Adalus gate is controlled by a second subset of the n qubits that is disjoint from the first subset. The at least one following gate can includes a plurality of controlled gates including the at least one controlled Z gate equivalent, the plurality of controlled gates operating under control of differing ones of the n qubits and further under control of the classical ancilla bit state to selectively apply phase adjustments to a subset of the n qubits, wherein the differing ones of the n qubits are not included in the subset of the n qubits.

Figure 8:
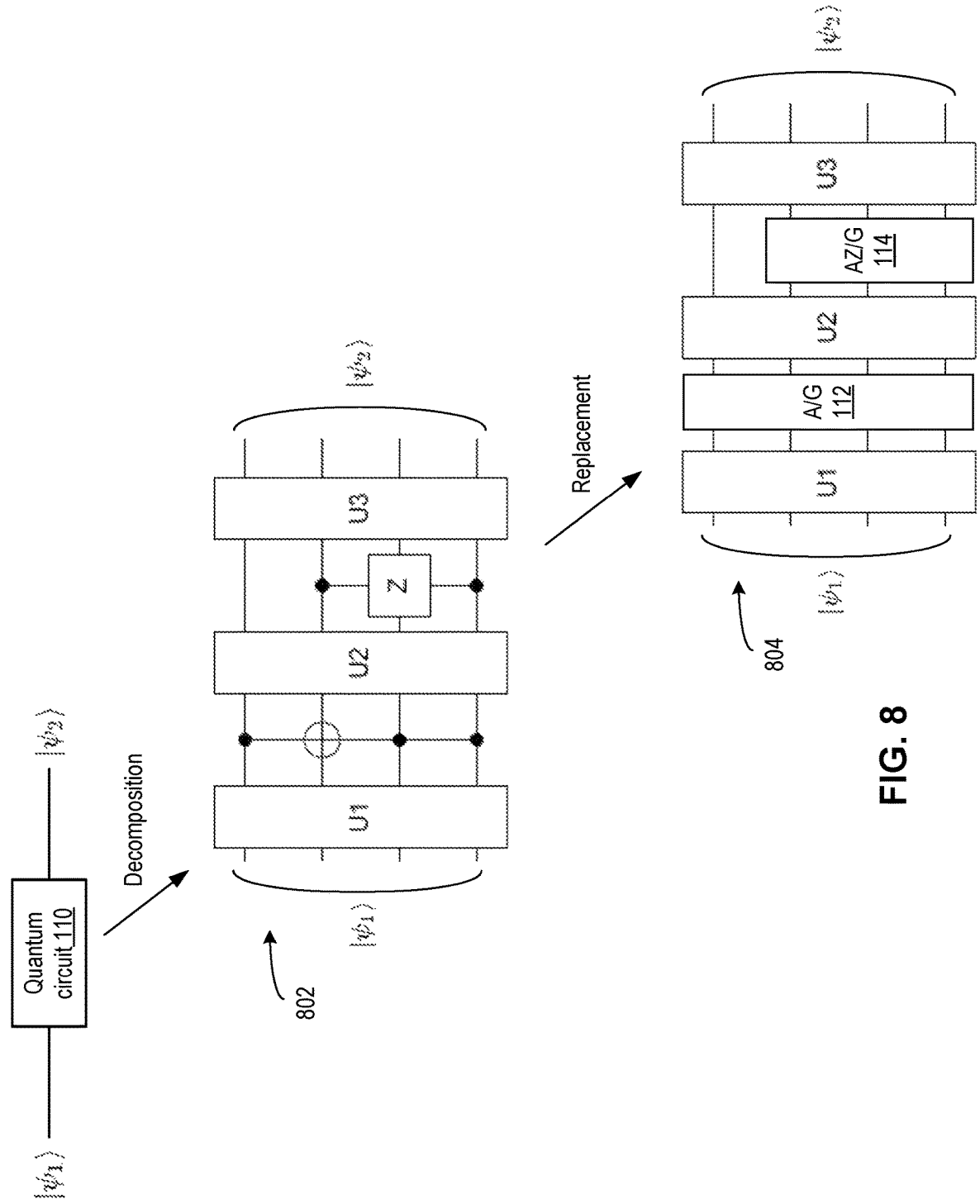
FIG. 8 is a flow/schematic block diagram of an embodiment of generating a substitute quantum logic gate in accordance with various embodiments.

FIG. 8 is a flow/schematic block diagram of an embodiment of generating a substitute quantum logic gate in accordance with various embodiments. While the foregoing description has focused on three families of gates, it should be noted that these three gate families can be used as building block for larger quantum circuits 110. In particular, a process is presented for transforming a quantum circuit 110 into a substitute quantum logic gate 804, by decomposing the quantum logic gate and replacing C*X gates into Adalus gates 112 and C*Z gates into AdalusZ gates 114 and/or Toffoli gates with measurement 113. In the example shown, a decomposed quantum logic gate 802 is generated by decomposing the quantum logic circuit 800 into unitaries U1, U2 and U3 and a CCCX gate and a CCZ gates. In the example shown, the substitute quantum logic circuit 804 is generated substituting an Adalus gate 112 for the CCCX gate and substituting an AdalusZ gate 114 for the CCZ gate.

In some circumstances, these replacements may or may not be beneficial. In various embodiments, the replacements are evaluated on a substitution-by-substitution basis to determine if they violate a constrain (e.g., no mid-circuit measurements, no ancilla qubits, exact implementations required, etc.) Furthermore, the replacements can also evaluated on a substitution-by-substitution basis to determine if one or more these replacement gates detrimentally effect the performance of the substitute quantum logic circuit 804 to the extent that the performance falls below some performance threshold. In either case, one or more substitutions can be reversed until all the constraints are satisfied and the performance threshold is achieved. In the alternative, the substitutions can be evaluated one by one and adopted only if the constraints are met and performance threshold is maintained.

While the process above has been discussed in conjunction with the decomposition and substitution associated with Adalus gates 112, Toffoli gates with measurement 113, and/or Adalus Z gates 114, similar techniques can be employed for implementations of other families of gates such as a multi-controlled Hadamard gate, a multi-controlled S gate, Y gate, swap gate, a Margolus Gate or other gate family or their replacements.

Figure 9:
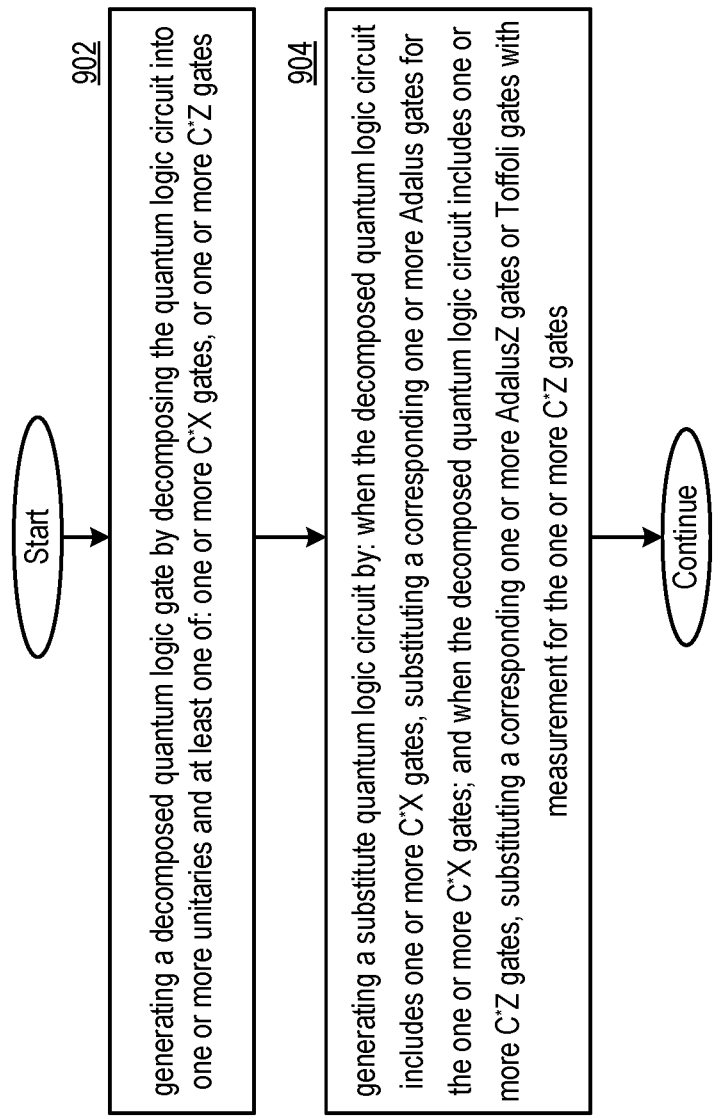
FIG. 9 is a flow diagram of an embodiment of a method in accordance with the present invention.

FIG. 9 is a flow diagram of an embodiment of a method in accordance with the present invention. In particular, a method is presented for use with one or more functions and features described in conjunctions with FIGS. 1-8. Step 902 include generating a decomposed quantum logic gate by decomposing the quantum logic circuit into one or more unitaries and at least one of: one or more C*X gates, or one or more C*X gates. Step 904 includes generating a substitute quantum logic circuit by: when the decomposed quantum logic circuit includes one or more C*X gates, substituting a corresponding one or more Adalus gates for the one or more C*X gates; and when the decomposed quantum logic circuit includes one or more C*Z gates, substituting a corresponding one or more AdalusZ gates or Toffoli gates with measurement for the one or more C*Z gates.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provides an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, a quantum register or other quantum memory and/or any other device that stores data in a non-transitory manner. Furthermore, the memory device may be in a form of a solid-state memory, a hard drive memory or other disk storage, cloud memory, thumb drive, server memory, computing device memory, and/or other non-transitory medium for storing data. The storage of data includes temporary storage (i.e., data is lost when power is removed from the memory element) and/or persistent storage (i.e., data is retained when power is removed from the memory element). As used herein, a transitory medium shall mean one or more of: (a) a wired or wireless medium for the transportation of data as a signal from one computing device to another computing device for temporary storage or persistent storage; (b) a wired or wireless medium for the transportation of data as a signal within a computing device from one element of the computing device to another element of the computing device for temporary storage or persistent storage; (c) a wired or wireless medium for the transportation of data as a signal from one computing device to another computing device for processing the data by the other computing device; and (d) a wired or wireless medium for the transportation of data as a signal within a computing device from one element of the computing device to another element of the computing device for processing the data by the other element of the computing device. As may be used herein, a non-transitory computer readable memory is substantially equivalent to a computer readable memory. A non-transitory computer readable memory can also be referred to as a non-transitory computer readable storage medium.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A quantum logic gate that implements a replacement for an n−1 qubit controlled X gate function to n qubits, the quantum logic gate comprising:
   a controlled gate that selectively applies, under control of a first subset of the n qubits, a pi radian Z-axis Bloch sphere rotation to a target qubit of the n qubits; and
   a pair of controlled Hadamard gates that selectively conjugate the target qubit under control of a second subset of the n qubits;
   wherein the first subset of the n qubits includes two or more qubits and the second subset of the n qubits includes at least one qubit that is different from the two or more qubits of the first subset, and wherein the target qubit is not included in either the first subset or the second subset.

2. The quantum logic gate of claim 1, wherein elements of the first subset of the n qubits are mutually exclusive of elements of the second subset of the n qubits.

3. The quantum logic gate of claim 2, wherein the first subset of the n qubits and the second subset of the n qubits are each non-zero proper subsets of the n qubits.

4. The quantum logic gate of claim 3, wherein a union of the first subset of the n qubits and the second subset of the n qubits consists of n−1 qubits of the n qubits.

5. The quantum logic gate of claim 4, wherein the elements of the first subset of the n qubits, the elements the second subset of the n qubits and the target qubit collectively span the n qubits.

6. The quantum logic gate of claim 1, wherein n=5, and the first subset of the n qubits includes two qubits and the second subset of the n qubits includes two qubits that are different from the two qubits of the first subset.

7. The quantum logic gate of claim 1, wherein n=4, and the first subset of the n qubits includes two qubits and the second subset of the n qubits includes a qubit that is different from the two qubits of the first subset.

8. A method for implementing a replacement for an n−1 qubit controlled X gate function on n qubits, the method comprising:
   selectively applying, under control of a first subset of the n qubits, a pi radian Z-axis Bloch sphere rotation to a target qubit of the n qubits; and
   selectively conjugating, via a pair of Hadamard gates, the target qubit under control of a second subset of the n qubits;
   wherein the first subset of the n qubits includes two or more qubits and the second subset of the n qubits includes at least one qubit that is different from the two or more qubits of the first subset and different from the target qubit, and wherein the target qubit is not included in either the first subset or the second subset.

9. The method of claim 8, wherein elements of the first subset of the n qubits are mutually exclusive of elements the second subset of the n qubits.

10. The method of claim 9, wherein the first subset of the n qubits and the second subset of the n qubits are each non-zero proper subsets of the n qubits.

11. The method of claim 10, wherein a union of the first subset and the second subset consists of n−1 qubits of the n qubits.

12. The method of claim 11, wherein the elements of the first subset of the n qubits, the elements the second subset of the n qubits and the target qubit collectively span the n qubits.

13. The method of claim 8, wherein n=5, and the first subset of the n qubits includes two qubits and the second subset of the n qubits includes two qubits that are different from the two qubits of the first subset.

14. The method of claim 8, wherein n=4, and the first subset of the n qubits includes two qubits and the second subset of the n qubits includes a qubit that is different from the two qubits of the first subset.

15. A quantum logic gate that implements a replacement for an n−1 qubit controlled Z gate function to n qubits, the quantum logic gate comprising:

a controlled Z gate equivalent that selectively applies, under control of a subset of the n qubits, a phase flip to a target qubit of the n qubits; and a pair of controlled Hadamard gates that selectively conjugate the target qubit under control of at additional one of the n qubits;

wherein the subset of the n qubits includes two or more qubits and the additional one of the n qubits is different from the two or more qubits of the subset and wherein the target qubit is not included in either the subset or the additional one of the n qubits.

16. The quantum logic gate of claim 15, wherein elements of the subset of the n qubits are mutually exclusive of the additional one of the n qubits.

17. The quantum logic gate of claim 16, wherein the elements of the subset of the n qubits, the additional one of the n qubits and the target qubit collectively span the n qubits.

18. The quantum logic gate of claim 17, wherein n=4.

19. The quantum logic gate of claim 15, wherein the subset is a non-zero proper subset of the n qubits.

20. The quantum logic gate of claim 15, wherein a union of the subset of the n qubits and the additional one of the n qubits consists of n−1 qubits of the n qubits.

* * * * *